(12) United States Patent
Kim

(10) Patent No.: US 9,748,160 B2
(45) Date of Patent: Aug. 29, 2017

(54) SEMICONDUCTOR PACKAGE, METHOD OF FABRICATING THE SAME, AND SEMICONDUCTOR MODULE

(71) Applicant: Soonbum Kim, Suwon-si (KR)

(72) Inventor: Soonbum Kim, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/245,243

(22) Filed: Aug. 24, 2016

(65) Prior Publication Data

US 2017/0110382 A1    Apr. 20, 2017

(30) Foreign Application Priority Data

Oct. 16, 2015    (KR) .......................... 10-2015-0144894

(51) Int. Cl.
*H01L 23/02*    (2006.01)
*H01L 23/28*    (2006.01)
(Continued)

(52) U.S. Cl.
CPC .... *H01L 23/3135* (2013.01); *H01L 23/49838* (2013.01); *H01L 25/0657* (2013.01);
(Continued)

(58) Field of Classification Search
CPC ......... H01L 23/3135; H01L 2225/1058; H01L 2225/06513; H01L 25/105; H01L 23/562; H01L 23/49586; H01L 23/49894; H01L 25/0657; H01L 23/552; H01L 2224/8192; H01L 2225/1023; H01L 23/49838;
(Continued)

(56) References Cited

U.S. PATENT DOCUMENTS 397,857 A    2/1889    Hunter
3,528,090 A    9/1970    Van Laer
(Continued)

FOREIGN PATENT DOCUMENTS

JP        2015-119077        6/2015
KR    10-2012-0128967    11/2012
TW        2013-H86310    *  2/2013    ... H01L 2224/32257

OTHER PUBLICATIONS

US 8,461,688, 06/2013, Hayashi et al. (withdrawn)

*Primary Examiner* — Jasmine Clark
(74) *Attorney, Agent, or Firm* — Muir Patent Law, PLLC

(57) ABSTRACT

A semiconductor package, a semiconductor module, a method of fabricating a semiconductor package are disclosed. The semiconductor package may include a substrate, a semiconductor chip, a connection terminal, a mold layer, and a protection layer. The protection layer may be provided to cover the substrate, the connection terminal, and the mold layer. The protection layer may be removed from a lower portion of the connection terminal, and thus, the lower portion of the connection terminal may be exposed. The connection terminal may be coupled to a module substrate through the lower portion, and a result, the semiconductor module may be fabricated. The connection terminal, the substrate, and the mold layer may be prevented from being exposed to outer air or moisture, owing to the presence of the protection layer.

18 Claims, 18 Drawing Sheets

(51) Int. Cl.
*H01L 23/552* (2006.01)
*H01L 23/31* (2006.01)
*H01L 23/498* (2006.01)
*H01L 25/10* (2006.01)
*H01L 25/065* (2006.01)

(52) U.S. Cl.
CPC .. *H01L 25/105* (2013.01); *H01L 2225/06513* (2013.01); *H01L 2225/06544* (2013.01); *H01L 2225/06555* (2013.01); *H01L 2225/06582* (2013.01); *H01L 2225/107* (2013.01); *H01L 2225/1035* (2013.01)

(58) Field of Classification Search
CPC . H01L 2223/54486; H01L 2225/06537; H01L 2924/00012; H01L 2924/181; H01L 23/60
See application file for complete search history.

(56) References Cited

U.S. PATENT DOCUMENTS

| | | |
|---|---|---|
| 3,767,397 A | 10/1973 | Akiyama |
| 5,641,113 A | 6/1997 | Somaki et al. |
| 5,956,605 A | 9/1999 | Akram et al. |
| 6,118,179 A | 9/2000 | Farnworth et al. |
| 6,180,504 B1 | 1/2001 | Farnworth et al. |
| 6,187,610 B1 | 2/2001 | Armezzani et al. |
| 6,291,270 B1 | 9/2001 | Saito |
| 6,306,683 B1 | 10/2001 | Dery et al. |
| 6,331,735 B1 | 12/2001 | Blish, II et al. |
| 6,498,052 B2 | 12/2002 | Brand |
| 6,528,890 B1 | 3/2003 | Brand |
| 6,528,894 B1 | 3/2003 | Akram et al. |
| 6,531,763 B1 | 3/2003 | Bolken et al. |
| 6,710,454 B1 | 3/2004 | Boon |
| 6,723,627 B1 | 4/2004 | Kariyazaki et al. |
| 6,746,956 B1 | 6/2004 | Padmanabhan et al. |
| 6,756,253 B1 | 6/2004 | Farnworth et al. |
| 6,791,036 B1 | 9/2004 | Chen et al. |
| 6,803,667 B2 | 10/2004 | Okura et al. |
| 6,852,931 B2 | 2/2005 | Hedler et al. |
| 6,858,799 B2 | 2/2005 | Hedler et al. |
| 6,972,249 B2 | 12/2005 | Akram et al. |
| 7,037,761 B2 | 5/2006 | Hedler et al. |
| 7,038,144 B2 | 5/2006 | Yasuda et al. |
| 7,169,691 B2 | 1/2007 | Doan |
| 7,170,185 B1 | 1/2007 | Hogerton et al. |
| 7,262,510 B2 | 8/2007 | Chung |
| 7,323,406 B2 | 1/2008 | Lim et al. |
| 7,338,891 B2 | 3/2008 | Jeong |
| 7,340,826 B2 | 3/2008 | Hedler et al. |
| 7,413,928 B2 | 8/2008 | Doan |
| 7,482,200 B2 | 1/2009 | Chung |
| 7,566,649 B2 | 7/2009 | Bernier et al. |
| 7,576,400 B1 | 8/2009 | Yin et al. |
| 7,646,102 B2 | 1/2010 | Boon |
| 7,656,012 B2 | 2/2010 | Doan |
| 7,678,681 B2 | 3/2010 | Oi |
| 7,807,503 B2 | 10/2010 | Doan |
| 7,808,112 B2 | 10/2010 | Boon |
| 7,812,447 B2 | 10/2010 | Boon |
| 7,859,108 B2 | 12/2010 | Lee et al. |
| 7,877,895 B2 | 2/2011 | Otsuka et al. |
| 7,943,422 B2 | 5/2011 | Boon |
| 8,181,356 B2 | 5/2012 | Otsuka et al. |
| 8,314,495 B2 | 11/2012 | Hayashi et al. |
| 8,405,225 B2 | 3/2013 | Yu et al. |
| 8,421,216 B2 | 4/2013 | Chen et al. |
| 8,441,124 B2 | 5/2013 | Wu et al. |
| 8,450,840 B1 * | 5/2013 | Tran .............. H01L 25/0655 257/693 |
| 8,563,417 B2 | 10/2013 | Lu et al. |
| 8,575,757 B2 | 11/2013 | Hayashi et al. |
| 8,581,410 B2 | 11/2013 | Hayashi et al. |
| 8,664,760 B2 | 3/2014 | Yu et al. |
| 8,822,269 B2 | 9/2014 | Hayashi et al. |
| 8,896,135 B2 | 11/2014 | Wang et al. |
| 8,912,650 B2 | 12/2014 | Choi et al. |
| 8,928,147 B2 | 1/2015 | Hayashi et al. |
| 8,941,238 B2 | 1/2015 | Aoi |
| 8,962,470 B2 | 2/2015 | Mizukoshi et al. |
| 8,970,034 B2 | 3/2015 | Gandhi |
| 8,980,739 B2 | 3/2015 | Cho et al. |
| 8,987,888 B2 | 3/2015 | Park et al. |
| 2004/0041241 A1 | 3/2004 | Vo et al. |
| 2010/0102433 A1 | 4/2010 | Doan |
| 2013/0299965 A1 | 11/2013 | Gandhi |
| 2014/0145315 A1 | 5/2014 | Lim |
| 2015/0061095 A1 * | 3/2015 | Choi .............. H01L 24/20 257/675 |
| 2015/0179614 A1 | 6/2015 | Murai |
| 2015/0270459 A1 * | 9/2015 | Dirscherl .......... H01L 33/56 257/98 |

* cited by examiner

SEMICONDUCTOR PACKAGE, METHOD OF FABRICATING THE SAME, AND SEMICONDUCTOR MODULE

CROSS-REFERENCE TO RELATED APPLICATIONS

This U.S. non-provisional patent application claims priority under 35 U.S.C. §119 to Korean Patent Application No. 10-2015-0144894, filed on Oct. 16, 2015, in the Korean Intellectual Property Office, the entire contents of which are hereby incorporated by reference.

BACKGROUND OF THE INVENTION

The present disclosure relates to a semiconductor device, and in particular, to a semiconductor package with a protection layer and a semiconductor module with the semiconductor package.

With the development of electronic industry, it becomes possible to cost-effectively manufacture light, small, fast, and high-performance electronic products. A semiconductor chip may be embedded in a semiconductor package, and the use of the semiconductor package makes it possible to easily use the semiconductor chip as a part of an electronic product. In addition, a semiconductor package provided with a semiconductor chip may be used as a semiconductor module. For example, in the semiconductor module, the semiconductor package is mounted on a module substrate. The semiconductor package may be connected to an external electronic device through outer terminals provided on the module substrate. The semiconductor package may include a connection terminal that may be coupled to a pad of the module substrate. If the connection terminal (e.g., solder) is exposed to the air, an oxide layer may be formed on the connection terminal. In a semiconductor module, the oxide layer may be interposed between the connection terminal and the module pad and may result in a contact failure between the connection terminal and the pad. A variety of studies are being conducted that may allow the semiconductor module to have improved electric characteristics and increased lifetime.

SUMMARY

Some embodiments of the inventive concept provide a semiconductor package covered with a protection layer. The protection layer may be provided to improve an endurance property of the semiconductor package.

Some embodiments of the inventive concept provide a highly reliable high-endurance semiconductor module, in which a semiconductor package with a protection layer is provided.

According to some embodiments of the inventive concept, a semiconductor package may include a first substrate having first and second surfaces facing each other, a first semiconductor chip provided on the first surface of the first substrate, a connection terminal provided on the second surface of the first substrate, the connection terminal having a first surface facing toward the second surface of the first substrate and a second surface facing away from the first substrate and that extends from one end of the first surface of the connection terminal to an opposite end of the first surface of the connection terminal, wherein the second surface of the connection terminal protrudes away from the second surface of the first substrate; and a protection layer covering the second surface of the first substrate and the entire second surface of the connection terminal.

In some embodiments, the semiconductor package may further include a first mold layer provided on the first surface of the first substrate to cover the first semiconductor chip.

In some embodiments, the protection layer may be provided to cover the first mold layer.

In some embodiments, the semiconductor package may further include a second substrate on the first semiconductor chip, a second semiconductor chip on the second substrate, a second mold layer provided on the second substrate to cover the second semiconductor chip, and a connecting portion interposed between the first and second substrates.

In some embodiments, the protection layer may be provided on the second substrate, the second mold layer, and the connecting portion.

In some embodiments, the semiconductor package may further include a second semiconductor chip stacked on the first semiconductor chip, and the first mold layer may be provided to cover the first and second semiconductor chips.

In some embodiments, the protection layer may contain fluorine.

In some embodiments, the first substrate may include a third surface connecting the first surface to the second surface, and the protection layer may be extended to cover the third surface of the first substrate.

In some embodiments, the protection layer may have a thickness having a value selected from a range between about 0.1 nm and about 1000 nm.

In come embodiments, a semiconductor module may include: a module substrate having a top surface and a bottom surface; a first semiconductor package mounted on the top surface of the module substrate, the first semiconductor package comprising a first substrate having a bottom surface facing the module substrate and a top surface, a first semiconductor chip on the first substrate, the first semiconductor chip mounted on the top surface of the first substrate, and a first mold layer covering the first semiconductor chip; a connection terminal interposed between the top surface of the module substrate and the bottom surface of the first substrate; and a protection layer conformally formed on the bottom surface of the first substrate and on side surfaces of the connection terminal between the bottom surface of first substrate and the top surface of the module substrate.

According to some embodiments of the inventive concept, a semiconductor module may include a module substrate, a first semiconductor package mounted on the module substrate to include a first substrate, a first semiconductor chip on the first substrate, and a first mold layer covering the first semiconductor chip, a connection terminal interposed between the module substrate and the first semiconductor package, and a protection layer provided on the connection terminal.

In some embodiments, the protection layer may cover bottom and side surfaces of the first substrate, and the connection terminal may be provided on the bottom surface of the first substrate.

In some embodiments, the protection layer may cover the first mold layer.

In some embodiments, the protection layer may contain fluorine.

In some embodiments, the semiconductor module may further include a second semiconductor package disposed on the first semiconductor package. The second semiconductor package may include a second substrate, a second semiconductor chip, and a second mold layer.

In some embodiments, the protection layer may cover the second semiconductor package.

In some embodiments, the module substrate may include a pad provided on a top surface thereof, and the connection terminal may be coupled to the pad.

In some embodiments, the protection layer may not fill a space between the top surface of the module board and the bottom surface of the first substrate.

In some embodiments the protection layer extends to the top surface of the module board.

According to some embodiments of the inventive concept, a method of fabricating a semiconductor package may include providing a semiconductor package including a substrate, a semiconductor chip, a mold layer, and a connection terminal, forming a protection layer on the semiconductor package to cover the substrate, the mold layer, and the connection terminal, and removing the protection layer from the connection terminal to expose a lower portion of the connection terminal. The substrate may have first and second surfaces facing each other, the semiconductor chip and the mold layer may be provided on the first surface of the substrate, and the connection terminal may be provided on the second surface of the substrate.

In some embodiments, the protection layer may cover the substrate and the mold layer.

In some embodiments, the method may further include providing a module substrate with a pad provided on a top surface thereof and coupling the connection terminal with the pad.

In some embodiments, the method may further include providing a second semiconductor package including a second substrate and a second semiconductor chip, the second substrate including a conductive pad provided on a top surface thereof, and electrically connecting the connection terminal to the conductive pad.

In some embodiments, the protection layer may contain fluorine.

In some embodiments, the removing of the protection layer may include dipping the lower portion of the connection terminal into alkali solution.

In some embodiments, the semiconductor chip may include a chip pad provided on a bottom surface thereof. The method may further comprise disposing the semiconductor chip on a supporting substrate, forming the mold layer on the supporting substrate to cover the semiconductor chip, removing the supporting substrate to expose the chip pad of the semiconductor chip, forming the substrate on the bottom surface of the semiconductor chip and a bottom surface of the mold layer; and forming the connection terminal on a bottom surface of the substrate. The substrate may include an interconnection pattern, which is electrically connected to the chip pad and is coupled to the connection terminal, and an insulating pattern covering the interconnection pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
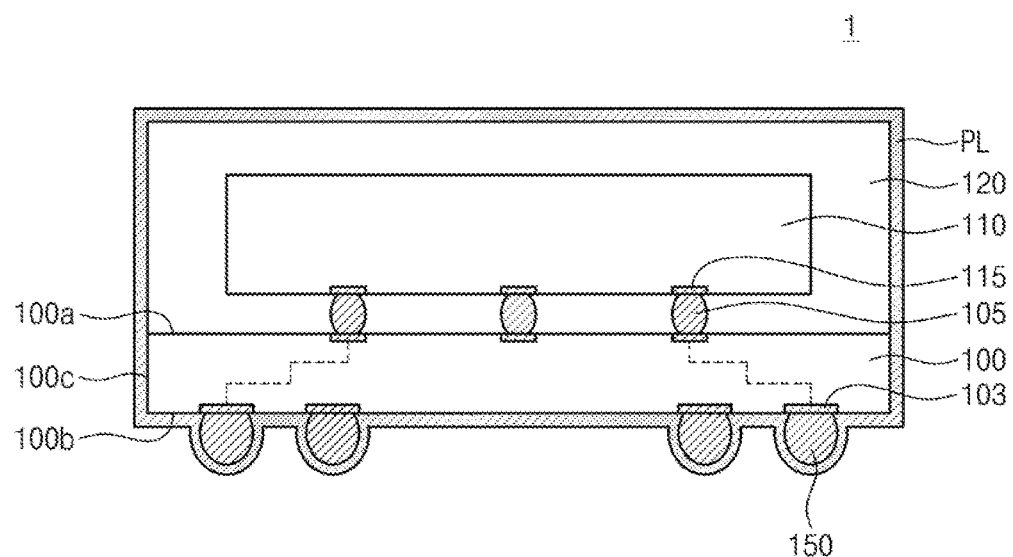
FIG. 1 is a sectional view illustrating a semiconductor package according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure The inventive concepts will now be described more fully hereinafter with reference to the accompanying drawings, in which exemplary embodiments of the inventive concepts are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. The inventive concepts and methods of achieving them will be apparent from the following exemplary embodiments that will be described in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

In the drawings, the size and relative sizes of layers and regions may be exaggerated for clarity. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular embodiments only and is not intended to be limiting of the invention. As used herein, the singular terms "a," "an" and "the" are intended to include the plural forms as well, unless the context clearly indicates otherwise. As used herein, the term "and/or" includes any and all combinations of one or more of the associated listed items and may be abbreviated as "/".

As used herein, expressions such as "at least one of," when preceding a list of elements, modify the entire list of elements and do not modify the individual elements of the list.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to another element, it may be directly connected or coupled to the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Similarly, it will be understood that when an element such as a layer, region or substrate is referred to as being "on" another element, it can be directly on the other element or intervening elements may be present. In contrast, the term "directly" means that there are no intervening elements. Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, and unless indicated otherwise, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) that does not permit electric current to pass therethrough is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Components described as thermally connected or in thermal communication are arranged such that heat will follow a path between the components to allow the heat to transfer from the first component to the second component. Simply because two components are part of the same device or package does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to a particular material simply because it provides incidental heat conduction, but are intended to refer to materials that are typically known as good heat conductors or known to have utility for transferring heat, or components having similar heat conducting properties as those materials.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Exemplary embodiments of aspects of the present inventive concepts explained and illustrated herein include their complementary counterparts. The same reference numerals or the same reference designators denote the same elements throughout the specification. FIG. 1 is a sectional view illustrating a semiconductor package according to some embodiments of the inventive concept.

Referring to FIG. 1, a semiconductor package 1 may include a substrate 100, a semiconductor chip 110, a mold layer 120, a connection terminal 150, and a protection layer PL. The substrate 100 may be a printed circuit board (PCB), but the inventive concept is not limited thereto. The substrate 100 may have a first surface 100a, a second surface 100b, and a third surface 100c. The second surface 100b of the substrate 100 may be opposite to the first surface 100a. The third surface 100c of the substrate 100 may connect the first surface 100a to the second surface 100b. Although not shown, conductive patterns and interconnection lines may be provided in the substrate 100. A pad 103 may be disposed on the second surface 100b of the substrate 100.

The various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring. As used herein, and unless indicated otherwise, items described as being "electrically connected" are configured such that an electrical signal can be passed from one item to the other.

As used herein, a semiconductor package may include one or more semiconductor chips stacked on a package substrate, or a package-on-package device including a plurality of packages.

In some embodiments the semiconductor chip 110 may be disposed on the first surface 100a (e.g., a top surface) of the substrate 100. The substrate 100 may be referred to as a package substrate. The semiconductor chip 110 may include an integrated circuit (e.g., memory circuits, logic circuits, or combinations thereof). The semiconductor chip 110 may include a chip pad 115 provided on a bottom surface thereof. An interposer 105 may be provided on the first surface 100a of the substrate 100 and may be coupled to the chip pad 115. The semiconductor chip 110 may be electrically connected to the substrate 100 through the interposer 105. The interposer 105 may include a conductive material (e.g., tin (Sn), silver (Ag), or alloys thereof). The interposer 105 may be provided in the form of a terminal such as a solder ball, a pillar, or a bump, and may be referred to as an internal package connection terminal, or an external connection terminal of a semiconductor chip. In certain embodiments, the semiconductor chip 110 may be mounted on the substrate 100 through bonding wires (not shown). It should be noted that the various pads, terminals and certain other components described herein may be described with reference to only one example pad, terminal, or component but as can be seen in the figures, a plurality of such pads, terminals, and other components are provided.

In this exemplary embodiment, the mold layer 120 may be disposed on the first surface 100a of the substrate 100 to cover the semiconductor chip 110. The mold layer 120 may be extended into a region between the substrate 100 and the semiconductor chip 110 to cover a side surface of the interposer 105. In certain embodiments, an additional underfill layer (not shown) may be further provided between the substrate 100 and the semiconductor chip 110. The mold layer 120 may include an insulating polymer material (e.g., epoxy molding compound (EMC)).

The connection terminal 150 may be provided on the second surface 100b of the substrate 100 and may be coupled to the pad 103. The connection terminal 150 may be provided in the form of a solder ball, a pillar, or a bump or other desired geometrical configurations. In some embodiments, the connection terminal 150 may include conductive bumps. For example, the connection terminal 150 may be electrically connected to electrically conductive components of both the semiconductor chip 110 and the substrate 100, for example, to connect integrated circuits of the semiconductor chip 110 to circuits and/or conductive lines of the substrate 100. However, the connection terminal 150 is not limited thereto. Items described as pads or ball lands herein may have substantially flat surfaces, while items described as balls or bumps herein may have curved surfaces.

In some embodiments, the connection terminal 150 may include a conductive material (e.g., tin (Sn), silver (Ag), or alloys thereof). As illustrated by a dotted line, the connection terminal 150 may be electrically connected to the semiconductor chip 110 through the interposer 105 and the substrate 100.

In some embodiments the protection layer PL may be provided on the connection terminal 150. In some embodiments, the connection terminal 150 may have a first, upper surface that faces toward the second surface 100b and contacts the pad 103 and a second, lower remaining surface that protrudes away from the second surface 100b of the substrate 100. The first surface of the connection terminal 150 may be a flat surface. The second surface of the connection terminal 150 may extend from one end of the first surface of the connection terminal 150 to an opposite end of the first surface of the connection terminal 150. In an exemplary embodiment, the protection layer PL may be provided on the connection terminal 150 in a manner such that the protection layer PL covers the entire second surface of the connection terminal 150. In some embodiments, the second surface of the connection terminal 150 may have concave shape in the middle thereof (e.g., in a vertical mid-portion thereof) and the lower most portion furthest away from the second surface 100b of the substrate 100 may have a tapered portion. In this exemplary embodiment, the protection layer PL may be provided on the connection terminal 150 in a manner such that the protection layer PL covers the entire lower surface of the connection terminal 150 including the tapered portion. The protection layer PL may be conformally formed at least on the lower surfaces of the connection terminals 150 and bottom surface 100b of the of the package substrate 100.

In some embodiments, the protection layer PL may cover the second and third surfaces 100b and 100c (e.g., a bottom surface and side surfaces) of the substrate 100 and the mold layer 120. The protection layer PL may be an organic layer. For example, the protection layer PL may contain carbon, oxygen, and fluorine, but is not limited thereto. Since the protection layer PL contains fluorine, the protection layer PL can have an improved waterproof property according to this exemplary embodiment. If the protection layer PL is not provided, the connection terminal 150 may react with an outer air or moisture, and as a result of such a reaction, an oxide layer (not shown) may be excessively formed on the connection terminal 150. By contrast, according to some embodiments of the inventive concept, since the protection layer PL is provided, it is possible to prevent an oxide layer from being formed on the connection terminal 150. In addition, the protection layer PL may prevent external moisture from being in contact with or being absorbed into the substrate 100 and the mold layer 120. If moisture is absorbed into the substrate 100 and the mold layer 120, corrosion may occur on conductive elements of the semiconductor package 1 (e.g., conductive pattern/interconnection lines (not shown) in the substrate 100, the pad 103, an integrated circuit of the semiconductor chip 110, the chip pad 115, or the interposer 105, and so forth). However, according to some embodiments of the inventive concept, since the semiconductor package 1 includes the protection layer PL, it is possible to prevent the conductive elements of the semiconductor package 1 from corroding. Despite of the presence of the protection layer PL, in the case where the protection layer PL is thinner than 0.1 nm, external moisture may reach the substrate 100 or the mold layer 120. Since a thickness of the protection layer PL, according to some embodiments, ranges from about 0.1 nm to about 1000 nm, the semiconductor package 1 can have improved reliability and endurance.

Figure 2A:
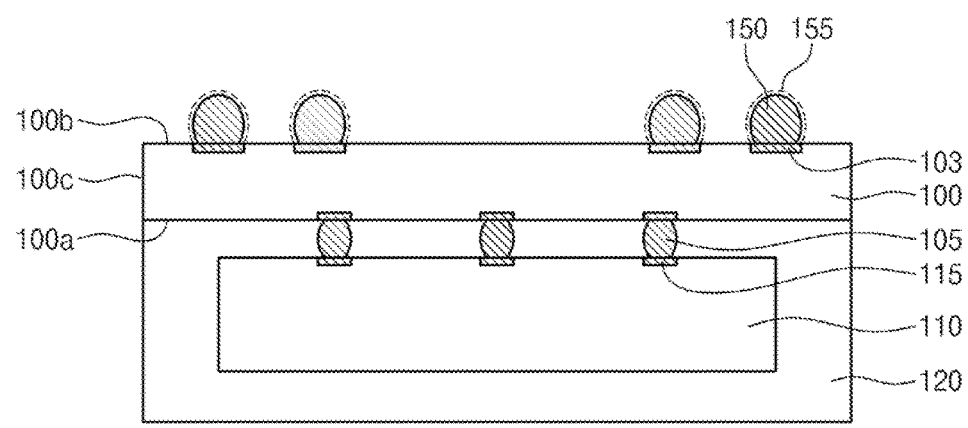
FIGS. 2A to 2C are sectional views illustrating a process of fabricating a semiconductor package according to some embodiments of the inventive concept.
Figure 2B:
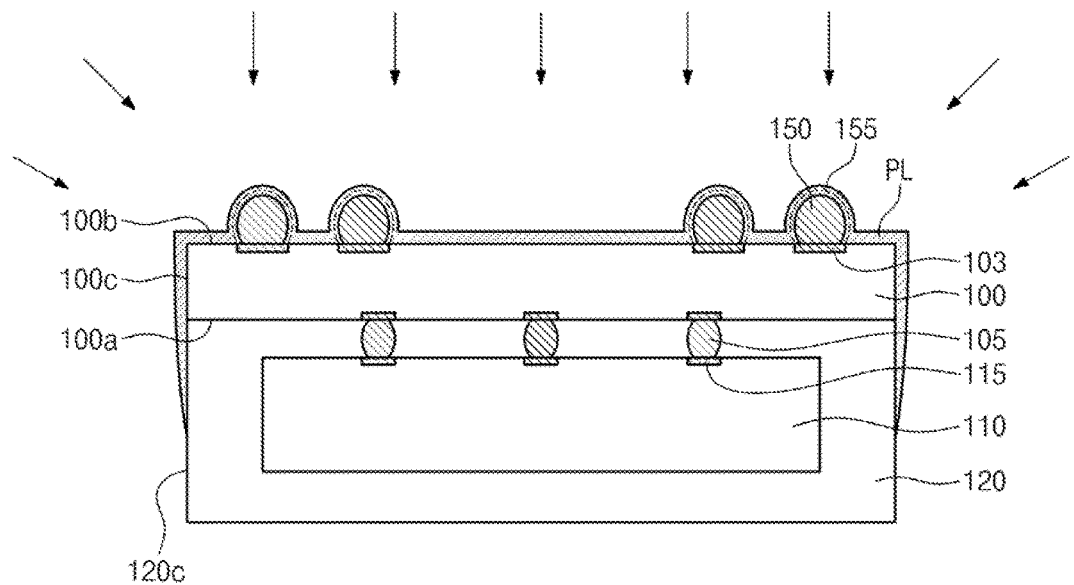
Figure 2C:
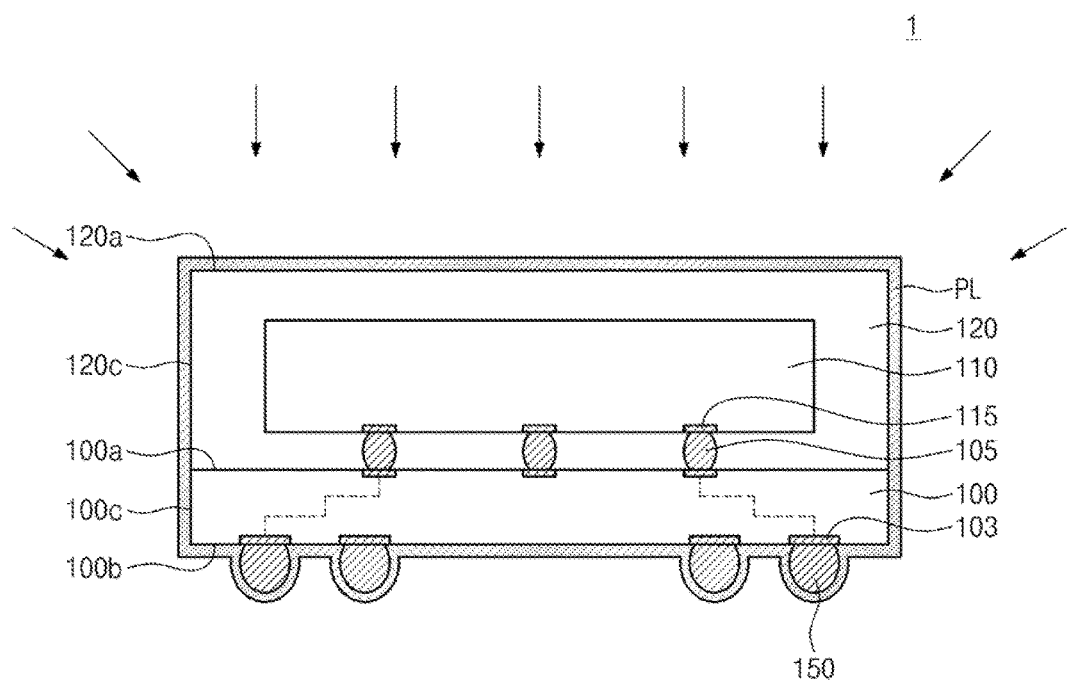

FIGS. 2A to 2C are sectional views illustrating a process of fabricating a semiconductor package according to some embodiments of the inventive concept. For concise description, a previously described element may be identified by a similar or identical reference number without repeating an overlapping description thereof.

Referring to FIG. 2A, the semiconductor chip 110 may be formed on the first surface 100a of the substrate 100. The mold layer 120 may be formed on the first surface 100a of the substrate 100 to cover the semiconductor chip 110. The connection terminal 150 may be formed on the second surface 100b of the substrate 100. The semiconductor chip 110, the mold layer 120, and the connection terminal 150 may be configured to have substantially the same features as those described with reference to FIG. 1. An oxide layer 155 may be formed on the connection terminal 150 if the connection terminal 150 is exposed to an outer air.

The substrate 100 may be loaded in a chamber (not shown). In this exemplary embodiment, the substrate 100 may be disposed in such a way that the second surface 100b faces up. A process of removing the oxide layer 155 may be performed to expose the connection terminal 150. For example, the process of removing the oxide layer 155 may be performed under vacuum conditions by a plasma etching technique, but is not limited thereto. In certain embodiments, the process of removing the oxide layer 155 may be omitted.

Referring to FIG. 2B in conjunction with FIG. 2A, the protection layer PL may be formed on the second surface 100b of the substrate 100, and on the connection terminal 150. For example, under vacuum conditions, a carbon-containing gas, an oxygen-containing gas, and/or a fluorine-containing gas may be supplied into the chamber where the substrate 100 is loaded. In this exemplary embodiment, the protection layer PL may be additionally formed on the third surface 100c of the substrate 100 or a side surface 120c of the mold layer 120. For example, the protection layer PL may be formed on the third surface 100c of the substrate 100 to completely cover the third surface 100c. The protection layer PL may be formed on the mold layer 120 to partially cover the side surface 120c of the mold layer 120 beyond the first surface 100a. The process of forming the protection layer PL may be performed in the same chamber for the oxide removal process of FIG. 2A.

In some embodiments, referring to FIG. 2C, the substrate 100 may be inverted, and thus, the first surface 100a of the substrate 100 may face up. A carbon-containing gas, an oxygen-containing gas, and/or a fluorine-containing gas may be supplied into the chamber, and thus, the protection layer PL may be formed on a top surface 120a of the mold layer 120. The protection layer PL may also be formed on the side surface 120c of the mold layer 120 and the third surface 100c of the substrate 100. The steps for forming the protection layer PL may be performed in a different order or manner. For example, a part of the protection layer PL may be formed on the top surface 120a of the mold layer 120, and thereafter, other portion of the protection layer PL may be formed on the second surface 100b, including the connection terminal 150, of the substrate 100. In certain embodiments, the step of forming a part of the protection layer PL described with reference to FIG. 2C may be omitted. For example, in some embodiments, the top surface 120a of the mold layer 120 may not be covered with the protection layer PL. The semiconductor package 1 of FIG. 1 may be fabricated by the above method described with reference to FIGS. 2A to 2C.

Figure 2D:
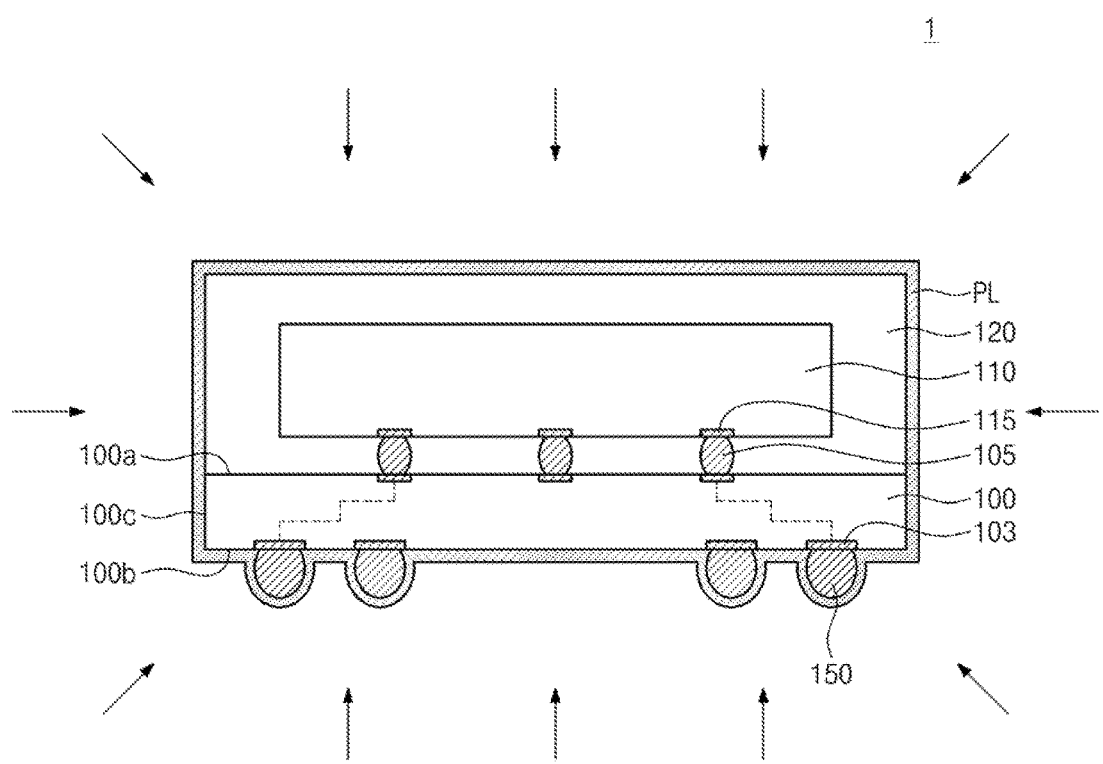
FIG. 2D is a sectional view illustrating a process of forming a protection layer according to some embodiments of the inventive concept.

FIG. 2D is a sectional view illustrating a process of forming a protection layer according to some embodiments of the inventive concept.

According to an exemplary embodiment as illustrated in FIG. 2D, the semiconductor chip 110, the mold layer 120, and the connection terminal 150 may be formed on the substrate 100. The semiconductor chip 110, the mold layer 120, and the connection terminal 150 may be formed using substantially the same method as described with reference to FIG. 2A. For example, in the case where the connection terminal 150 is exposed to an outer air, an oxide layer 155 (e.g., of FIG. 2A) may be formed on the connection terminal 150. A process of removing the oxide layer 155 may be performed similarly as described above (e.g., with reference to FIG. 2A) to expose the connection terminal 150.

A carbon-containing gas, an oxygen-containing gas, and a fluorine-containing gas may be supplied onto the first to third surfaces 100a, 100b, and 100b of the substrate 100. In some embodiments, the protection layer PL may be formed on the substrate 100, the connection terminal 150, and the mold layer 120 at substantially the same time. The protection layer PL may cover the substrate 100, the connection terminal 150, and the mold layer 120.

Hereinafter, a semiconductor module and a method of fabricating the same according to some embodiments of the inventive concept will be described.

FIGS. 3A to 3D are sectional views illustrating a process of fabricating a semiconductor module according to some embodiments of the inventive concept. For concise description, an element or step described in the previous embodiments may be identified by a similar or identical reference number without repeating an overlapping description thereof.

Figure 3A:
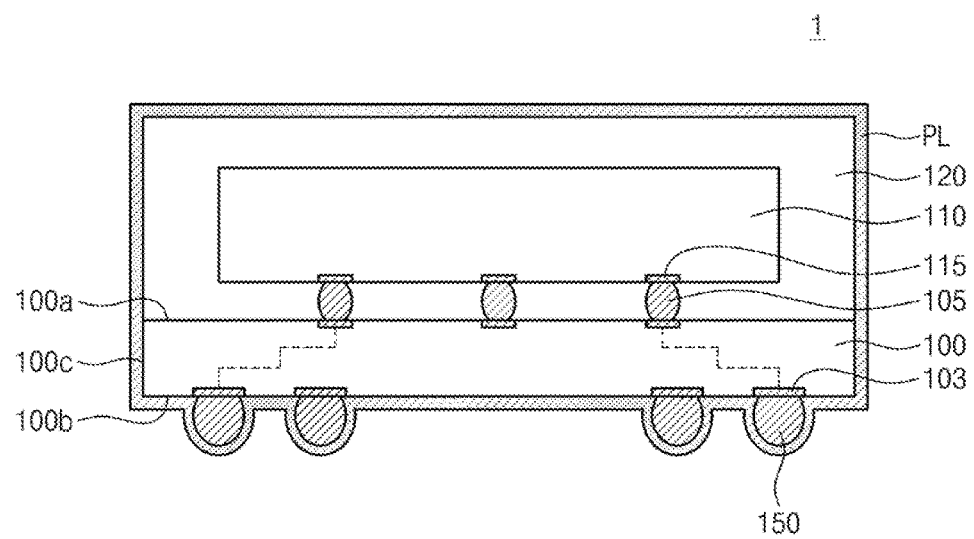
FIGS. 3A to 3D are sectional views illustrating a process of fabricating a semiconductor module according to some embodiments of the inventive concept.

Referring to FIG. 3A, the semiconductor package 1 may be prepared. The semiconductor package 1 may be configured to have substantially the same features as that described with reference to FIG. 1. For example, the semiconductor package 1 may include the substrate 100, the semiconductor chip 110, the mold layer 120, and the connection terminal 150. The protection layer PL may cover the substrate 100, the connection terminal 150, and the mold layer 120.

Figure 3B:
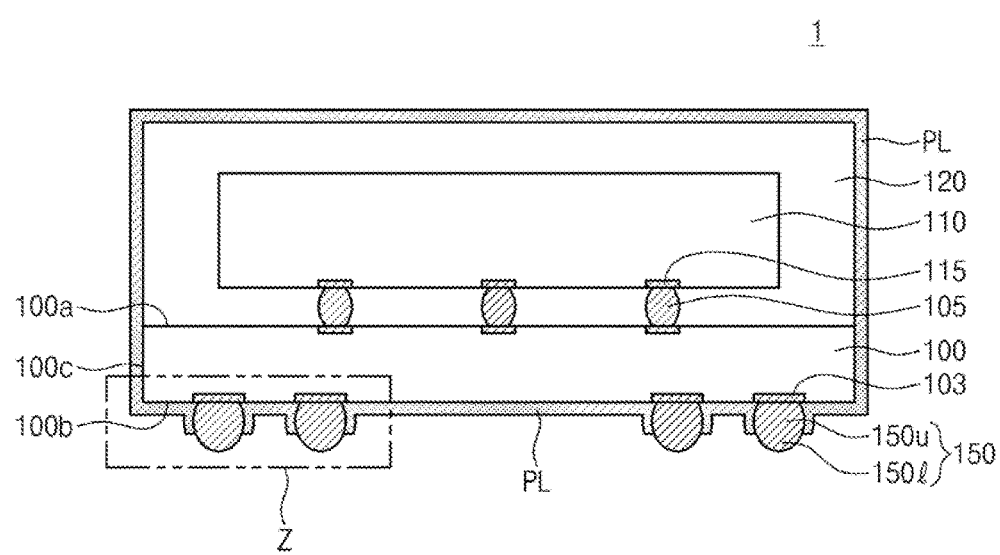

Referring to FIG. 3B, in some embodiments, the protection layer PL may be removed to expose a lower portion 150l of the connection terminal 150. For example, the lower portion 150l of the connection terminal 150 may be dipped into alkali solution. The alkali solution may be or contain isopropyl alcohol or ammonia solution. Since the protection layer PL contains fluorine, the protection layer PL can be reacted with the alkali solution and may be removed. In this exemplary embodiment, an upper portion 150u of the connection terminal 150, the second and third surfaces 100b and 100c of the substrate 100, and the protection layer PL on the mold layer 120 may not be removed. If the protection layer PL is thicker than 1000 nm, the protection layer PL may remain on the lower portion 150l of the connection terminal 150 and may not expose the lower portion 150l of the connection terminal 150 even if the lower portion 150l is dipped into an alkali solution. In some embodiments, since the thickness of the protection layer PL ranges from 0.1 nm to 1000 nm, the protection layer PL may be removed to expose the lower portion 150l of the connection terminal 150.

Figure 3C:
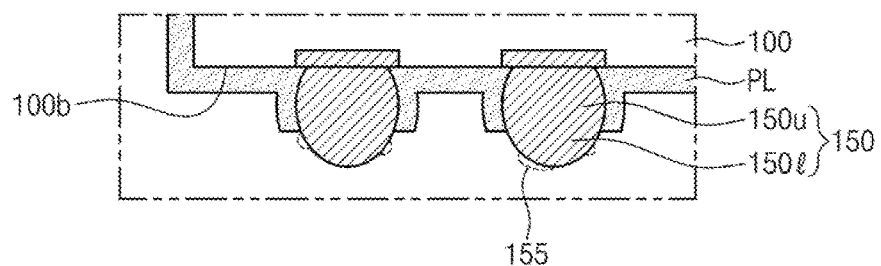

FIG. 3C illustrates another exemplary embodiment of the process for removing the protection layer. The sectional view of FIG. 3C may correspond to a region 7' of FIG. 3B.

Referring to FIG. 3C, the protection layer PL may be removed using alkali solution. The alkali solution may serve as a flux solution. For example, even after the oxide removal process described with reference to FIG. 2A, a portion of the oxide layer 155 may remain on the connection terminal 150, as illustrated by the dotted line. The use of the alkali solution may make it possible to remove the remaining portion of the oxide layer 155 and thereby to expose the lower portion 150l of the connection terminal 150. The oxide layer 155 and the protection layer PL may be removed in the same process.

Figure 3D:
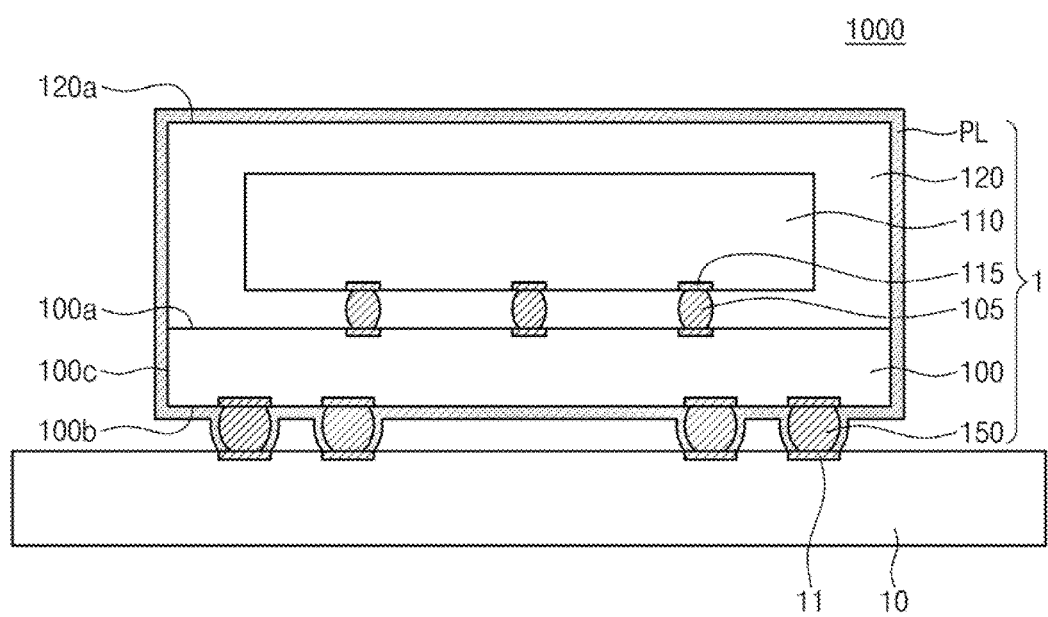

Referring to FIG. 3D, the semiconductor package 1 may be mounted on the module substrate 10 (also referred to herein as a module board, which may be formed, for example, of a printed circuit board (PCB)). The module substrate 10 may have a top surface on which a connection pad 11 is provided. The connection pad 11 may include a conductive material (e.g., copper (Cu) or aluminum (Al)). The lower portion 150l of the connection terminal 150 may be coupled to the connection pad 11 and the semiconductor package 1 may be electrically connected to the module substrate 10 through the connection terminal 150. If the protection layer PL or an oxide layer 155 (e.g., of FIG. 2A or FIG. 3C) remains on the lower portion 150l of the connection terminal 150, the connection terminal 150 and the connection pad 11 may not properly connect to each other and thus may provide poor electrical connection between the connection terminal 150 and the connection pad 11. The lower portion 150l of the connection terminal 150 may be exposed to allow the connection terminal 150 to be robustly coupled to the connection pad 11. In certain embodiments, a solder or solder paste (not shown) may be further provided on the connection pad 11. The connection terminal 150 may be coupled to a solder ball (not shown), which is formed of a solder or solder paste, and may be electrically connected to the connection pad 11. As shown in FIG. 3D, in some exemplary embodiments, the protection layer PL may extend to or toward and/or contact the top surface of the module substrate 10. However, there may be a space, and thus no protection layer PL in other locations between the bottom surface 100b of the package substrate 100 and the top surface of the module substrate 10.

In an exemplary embodiment, the connection terminal 150 may have a first surface that may contact the connection pad 103 provided on the second surface 100b of the first substrate 100, a second surface that may contact the connection pad 11 provided on an upper surface of the module substrate 10, and outer surfaces connecting the first and second surfaces of the connection terminal 150. In a semiconductor module 1000 according to some embodiments of the inventive concept, the protection layer PL may cover the outer surfaces of the connection terminal 150, the substrate 100, and the mold layer. The protection layer PL may prevent external moisture from being in contact with or being absorbed into the connection terminal 150, the substrate 100, and the mold layer 120. Accordingly, it is possible to significantly reduce the effect of corrosion on the conductive elements of the semiconductor package 1. This may make it possible to realize the semiconductor module 1000 with increased lifetime and improved reliability.

Hereafter, a semiconductor package and a method of fabricating the same according to some embodiments of the inventive concept will be described.

Figure 4:
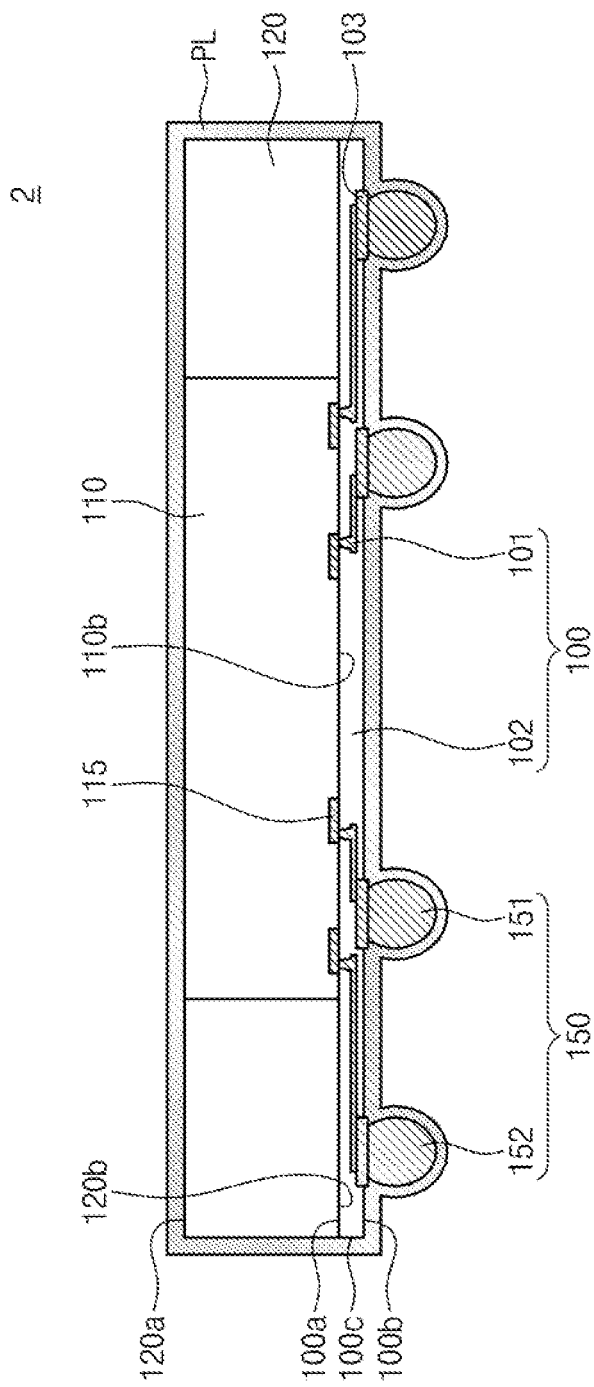
FIG. 4 is a sectional view illustrating a semiconductor package according to some embodiments of the inventive concept.

FIG. 4 is a sectional view illustrating a semiconductor package according to some embodiments of the inventive concept. For concise description, an element or step described in the previous embodiments may be identified by a similar or identical reference number without repeating an overlapping description thereof.

Referring to FIG. 4, a semiconductor package 2 may include the substrate 100, the semiconductor chip 110, the mold layer 120, and the connection terminal 150. The semiconductor chip 110 and the mold layer 120 may be disposed on the first surface 100a of the substrate 100. The mold layer 120 may cover a side surface of the semiconductor chip 110 but does not cover a top surface of the semiconductor chip 110. In certain embodiments, although not illustrated in FIG. 4, the mold layer 120 may be provided to cover the side and top surfaces of the semiconductor chip 110.

In this exemplary embodiment, the substrate 100 may include a redistribution layer. For example, the substrate 100 may include an interconnection pattern 101 and an insulating pattern 102. The interconnection pattern 101 may be provided on a bottom surface 110b of the semiconductor chip 110 and a bottom surface 120b of the mold layer 120. The interconnection pattern 101 may include opposite ends, which are coupled to the chip pad 115 and the connection terminal 150, respectively. Accordingly, it is not necessary to provide a printed circuit board (PCB) for electrically connecting the semiconductor chip 110 to an external device in the semiconductor package 1. In certain embodiments, an interposer (not shown in FIG. 4, but shown, e.g., in FIG. 1, FIGS. 2A-2D, and FIGS. 3A-3D as element 105) may be further interposed between the chip pad 115 and the interconnection pattern 101. The insulating pattern 102 may be provided on the bottom surface 110b of the semiconductor chip 110 and the bottom surface 120b of the mold layer 120 to cover the interconnection pattern 101. Since, according to this exemplary embodiment, a redistribution layer, instead of the PCB, is used as the substrate 100, the semiconductor package 1 can have a reduced size.

The connection terminal 150 may be disposed on the second surface 100b of the substrate 100. The connection terminal 150 may include a first connection terminal 151 and a second connection terminal 152. When viewed in a plan view, the first connection terminal 151 may be overlapped with the semiconductor chip 110, and the second connection terminal 152 may be overlapped with the mold layer 120. In an alternative embodiment, the first connection terminal 151 or the second connection terminal 152 may be omitted. For example, the connection terminal 150 may include only the first connection terminal 151 overlapping the semiconductor chip 110 in one embodiment. Alternatively, the connection terminal 150 may include only the second connection terminal 152 overlapping the mold layer 120 in another embodiment. In some embodiments, the interconnection pattern 101 may be configured to increase a degree of freedom in disposing the connection terminal 150. For example, the interconnection pattern 101 may be extended to the bottom surface 120b of the mold layer 120, and this may make it possible to allow not only the first connection terminal 151 but also the second connection terminal 152 to be provided. In addition, it is possible to reduce limitation on the number of the connection terminals 150. The connection terminal 150 may have substantially the same as the connection terminal 150 described with reference to FIG. 1 in terms of their structures and materials.

The protection layer PL may be provided on the connection terminal 150, the substrate 100, and the mold layer 120. The protection layer PL may include carbon, oxygen, and fluorine. The protection layer PL may have a thickness ranging from about 0.1 nm to about 1000 nm. The protection layer PL may be formed in the same or similar manner as the method of forming the protection layer PL as described with reference to FIGS. 2A to 2C or FIG. 2D.

Figure 5A:
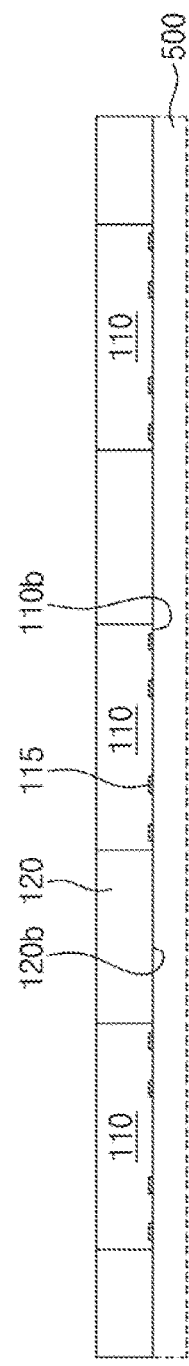
FIGS. 5A to 5C are sectional views illustrating a process of fabricating a semiconductor package according to some embodiments of the inventive concept.
Figure 5B:
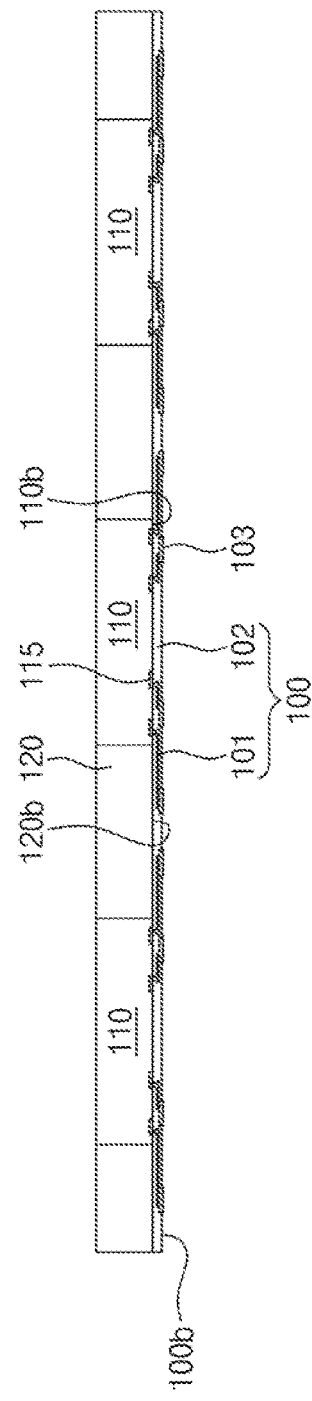
Figure 5C:
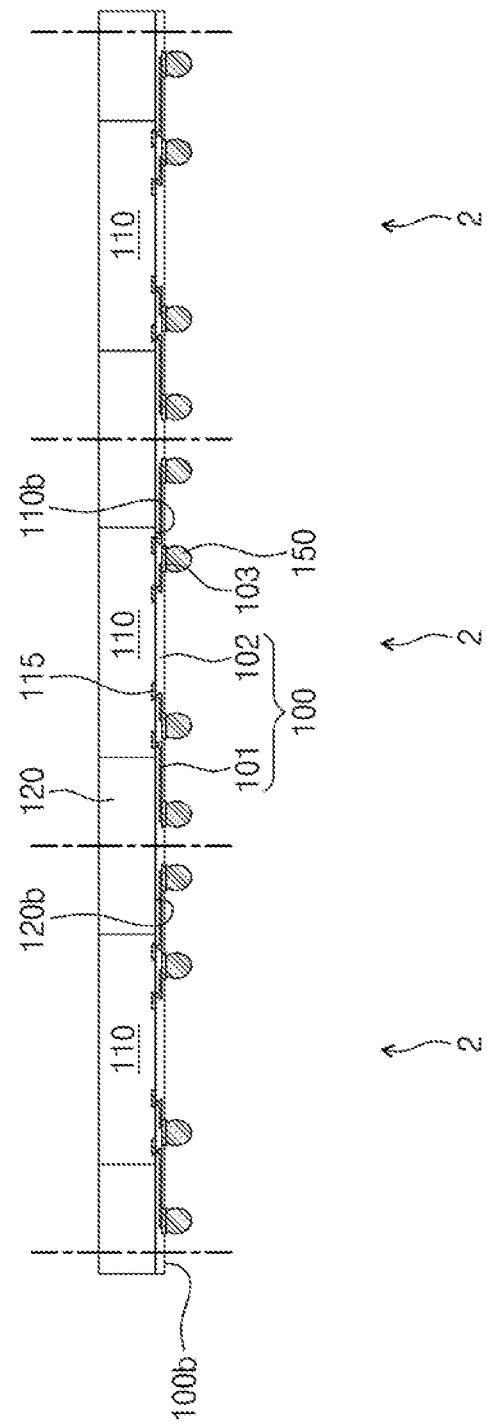

FIGS. 5A to 5C are sectional views illustrating a process of fabricating a semiconductor package (e.g., of FIG. 4) according to some embodiments of the inventive concept.

Referring to FIG. 5A, the semiconductor chip 110 may be provided on a supporting substrate 500. The chip pad 115 may be formed on the bottom surface 110b of the semiconductor chip 110. The chip pad 115 may be formed to face an upper surface of the supporting substrate 500. In some embodiments, a plurality of the semiconductor chips 110 may be provided on the supporting substrate 500. The mold layer 120 may be formed on the supporting substrate 500 to cover the side surfaces of the semiconductor chips 110. In certain embodiments, the mold layer 120 may be provided to further cover the top surfaces of the semiconductor chips 110. Thereafter, the supporting substrate 500 may be removed to expose the bottom surfaces 110b of the semiconductor chips 110 and the chip pad 115.

Referring to FIG. 5B, the interconnection pattern 101 and the insulating pattern 102 may be formed on the bottom surfaces 110b of the semiconductor chips 110 and the bottom surface 120b of the mold layer 120, and as a result, the substrate 100 may be prepared. The insulating pattern 102 may be formed to expose the chip pad 115. The interconnection pattern 101 may be formed in the insulating pattern 102. An end of the interconnection pattern 101 may be coupled to one of the chip pads 115. An opposite end of the interconnection pattern 101 may be horizontally extended from the end to the bottom surfaces 110b of the semiconductor chips 110 or the bottom surface 120b of the mold layer 120. The opposite end of the interconnection pattern 101 may be exposed by the insulating pattern 102.

The conductive pad 103 may be formed on the opposite end of the interconnection pattern 101.

Referring to FIG. 5C in conjunction with FIG. 4, the connection terminal 150 may be formed on the conductive pad 103. Thereafter, a sawing process may be performed on the substrate 100 to separate the semiconductor packages 2 from each other.

FIGS. 6A to 6E are sectional views illustrating a method of fabricating a semiconductor package according to some embodiments of the inventive concept. For concise description, an element or step described in the previous embodiments may be identified by a similar or identical reference number without repeating an overlapping description thereof.

Figure 6A:
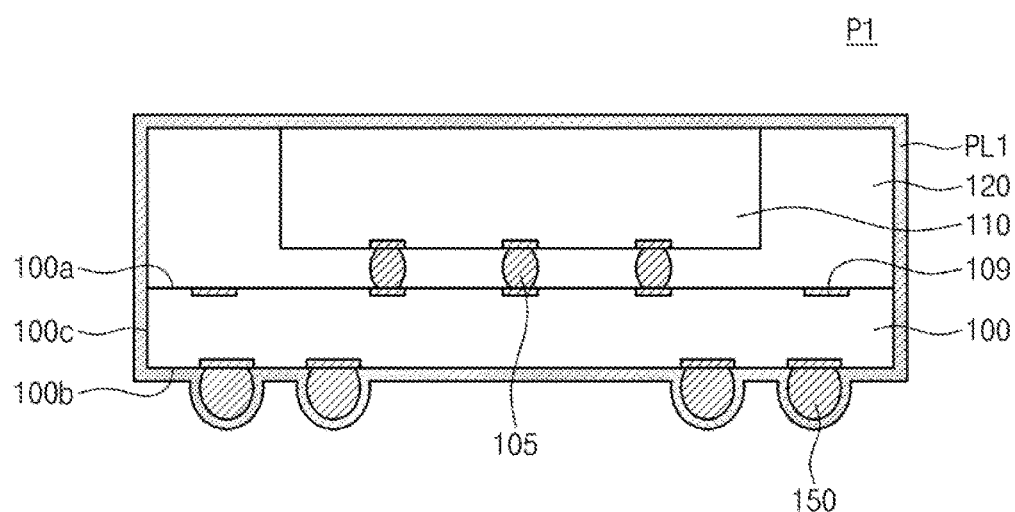
FIGS. 6A to 6E are sectional views illustrating a method of fabricating a semiconductor package according to some embodiments of the inventive concept.

Referring to FIG. 6A, a first package P1 may be prepared. The first package P1 may include a first substrate 100, a first semiconductor chip 110, and a first mold layer 120. The first semiconductor chip 110, the first mold layer 120, and the connection terminal 150 may be formed to have the same or similar features as the semiconductor chip 110, the mold layer 120, and the connection terminal 150 described with reference to FIG. 1. The lower substrate 100 may be a printed circuit board or a redistribution layer described with reference to FIG. 4. A pad 109 may be provided on the first surface 100a of the first substrate 100. The first semiconductor chip 110 may be disposed on the first surface 100a of the first substrate 100. The interposer 105 may be interposed between the first substrate 100 and the first semiconductor chip 110. The first mold layer 120 may be provided on the first surface 100a of the first substrate 100 to cover the first semiconductor chip 110. The connection terminal 150 may be disposed on the second surface 100b of the first substrate 100.

A first protection layer PL1 may be formed to cover the connection terminal 150, the first substrate 100, and the mold layer 120 and hermetically seal the first package P1. The first protection layer PL1 may be formed to have substantially the same features as the protection layer PL of FIG. 1. The first protection layer PL1 may be formed in the same or similar manner as the method of forming the protection layer PL described with reference to FIGS. 2A to 2C or FIG. 2D.

Figure 6B:
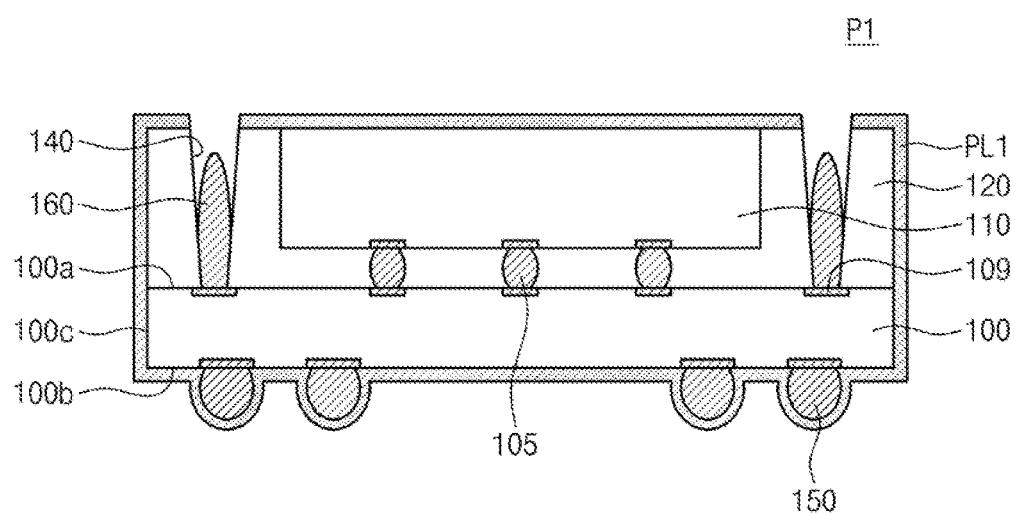

Referring to FIG. 6B, an opening 140 may be formed in the first protection layer PL1 and the first mold layer 120. The opening 140 may be formed to expose the pad 109. A solder 160 having a tapered upper portion, but not limited thereto, may be formed in the opening 140 and may be coupled to the pad 109. For example, the opening 140 may be formed above the pad 109 such that the pad 109 is exposed to the opening 140. In forming opening 140, a portion of first protection layer PL1 may be removed. In some embodiments, a solder paste (not shown) may be formed in the opening 140 rather than a solder 160. In certain embodiments, the solder 160 or the solder paste may be omitted.

Figure 6C:
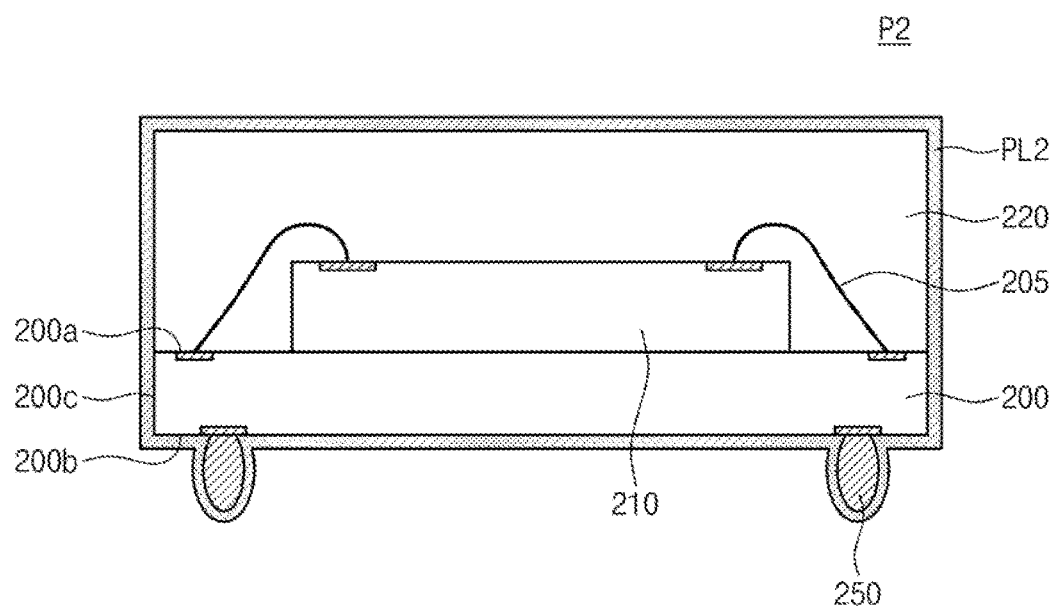

Referring to FIG. 6C, a second package P2 may be prepared. The second package P2 may include a second substrate 200, a second semiconductor chip 210, and a second mold layer 220. The second substrate 200 may be a printed circuit board or the redistribution layer described with reference to FIG. 4. The second substrate 200 may have a top surface 200a, a bottom surface 200b, and a side surface 200c. The second semiconductor chip 210 may be disposed on the top surface 200a of the second substrate 200. The second semiconductor chip 210 may be electrically connected to the second substrate 200 through bonding wires 205. Alternatively, the second semiconductor chip 210 may be electrically connected to the second substrate 200 through solders or bumps.

An upper connection terminal 250 may be disposed on the bottom surface 200b of the second substrate 200. The upper connection terminal 250 may be substantially the same as the connection terminal 150 of FIG. 1 in terms of their materials, structures, and arrangements.

A second protection layer PL2 may be formed on the upper connection terminal 250, the second substrate 200 and the second mold layer 220. The second protection layer PL2 may be substantially the same as the protection layer PL of FIG. 1 in terms of their materials and thicknesses. For example, the protection layer PL2 may include carbon, oxygen, and fluorine and may have a thickness ranging from about 0.1 nm to about 1000 nm. The second protection layer PL2 may be formed using the same or similar method as that for the protection layer PL described with reference to FIGS. 2A to 2C or FIG. 2D. The second protection layer PL2 may prevent the second package P2 from being exposed to an outer air or moisture. The second protection layer PL2 may prevent an oxide layer (not shown) from being formed on the upper connection terminal 250.

Figure 6D:
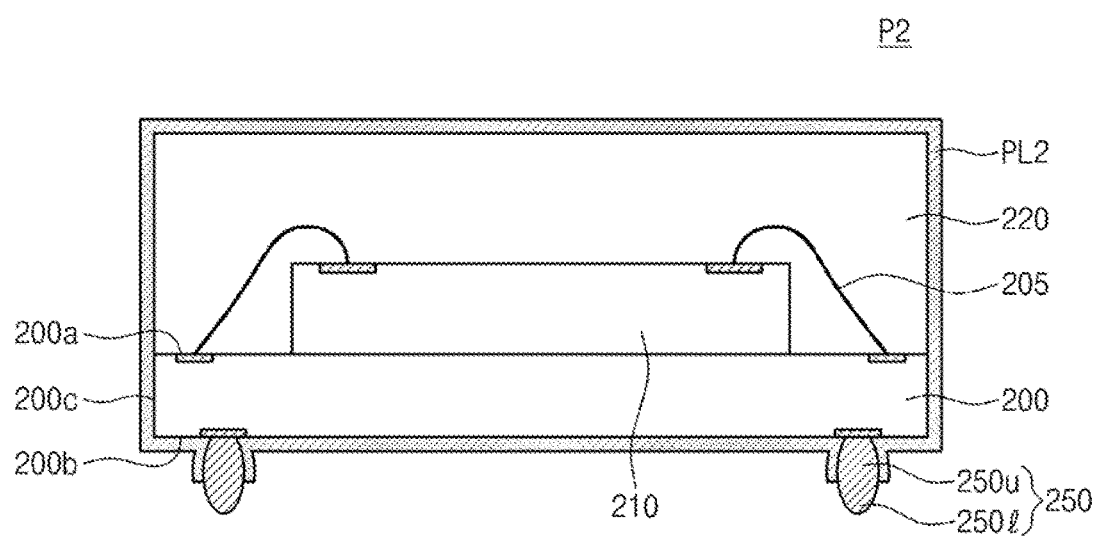

Referring to FIG. 6D, in some embodiments, the second protection layer PL2 may be removed to expose the lower portion 250l of the upper connection terminal 250. The removal of the second protection layer PL2 may be performed using the same or similar method of removing the protection layer PL described with reference to FIG. 3B. For example, the second protection layer PL2 on the lower portion 150l of the upper connection terminal 250 may be removed by alkali solution. The upper portion 250u of the upper connection terminal 250, the bottom surface 200b and the side surface 200c of the second substrate 200, and the protection layer PL on the mold layer 120 may not be removed.

Figure 6E:
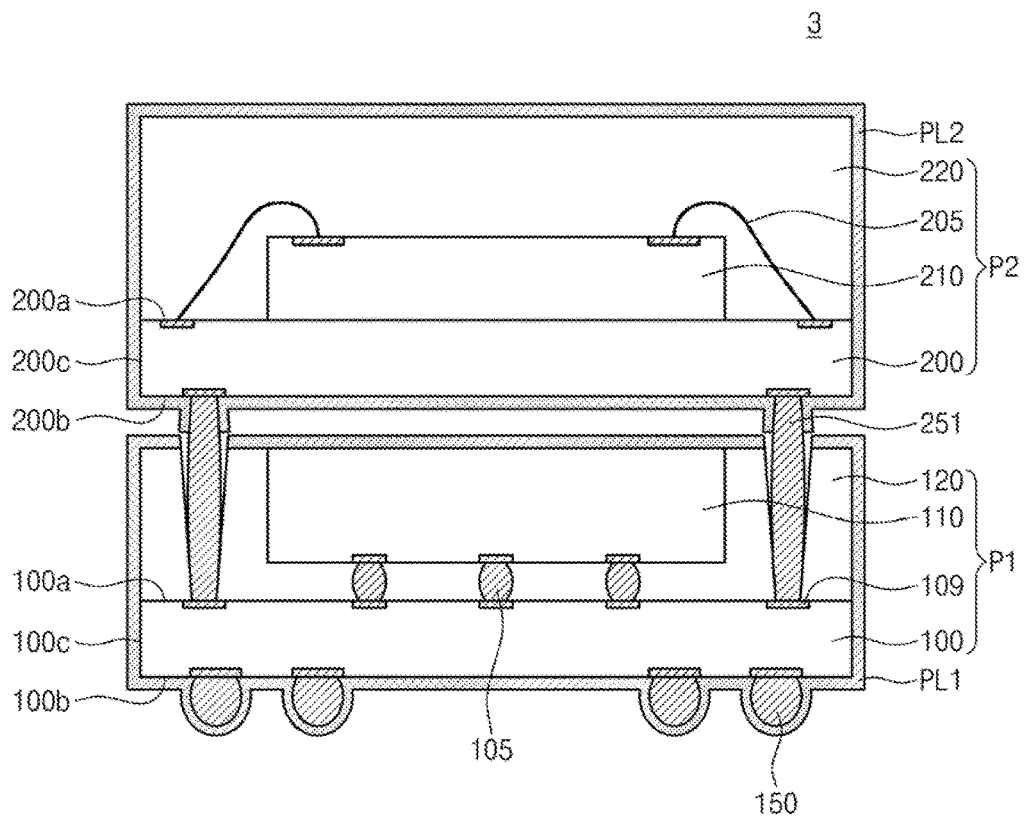

Referring to FIG. 6E in conjunction with FIGS. 6B and 6D, a connecting portion 251 may be formed to electrically connect the second substrate 200 to the first substrate 100. The connecting portion 251 may be formed by directly or indirectly joining the second connection terminal 250 (e.g., of FIG. 6D) with the pad 109. For example, the second connection terminal 250 (e.g., of FIG. 6D) may be connected to the solder 160 (e.g., of FIG. 6B) on the first substrate 100, thereby forming the connecting portion 251. Alternatively, the solder 160 of FIG. 6B may be omitted, and the upper connection terminal 250 may be directly coupled to the pad 109. Since a lower portion 250l of the upper connection terminal 250 has an exposed portion that is not covered with an oxide layer, the first substrate 100 and the second substrate 200 can be effectively connected to each other through the connecting portion 251. The connecting portion 251 may be interposed between the first substrate 100 and the second substrate 200. The connecting portion 251 may be provided on the pad 109 of the first substrate 100 and laterally spaced apart from the first semiconductor chip 110.

In some embodiments, since, after the formation of the second protection layer PL2 and the first protection layer PL1, the second package P2 is mounted on the first package P1, the second protection layer PL2 may not be connected to the first protection layer PL1. Accordingly, the semiconductor package 3 including the first package P1, the second package P2, and the protection layers PL1 and PL2 may be fabricated.

Figure 7:
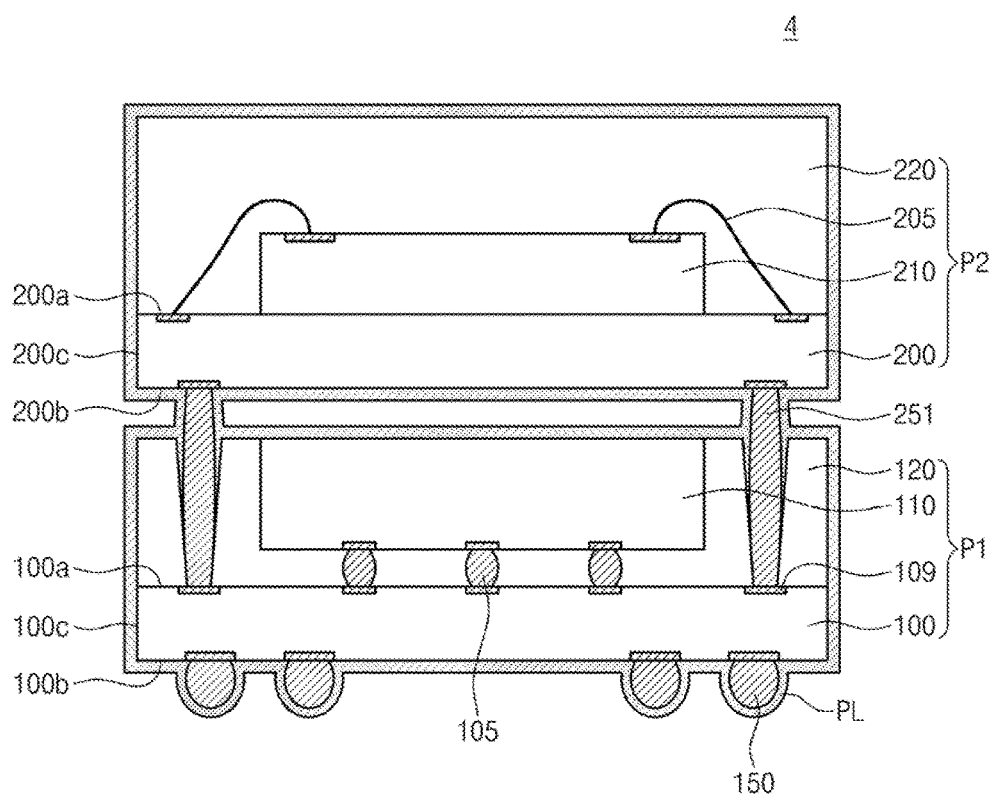
FIG. 7 is a sectional view illustrating a semiconductor package according to some embodiments of the inventive concept.

FIG. 7 is a sectional view illustrating a semiconductor package according to some embodiments of the inventive concept. For concise description, an element or step described in the previous embodiments may be identified by a similar or identical reference number without repeating an overlapping description thereof.

Referring to FIG. 7, a semiconductor package 4 may include the first package P1, the second package P2, the connecting portion 251, and the connection terminal 150. The first package P1, the second package P2, and the connecting portion 251 may be configured to have substantially the same features as those described with reference to FIGS. 6A to 6E. The connection terminal 150 may be disposed on the second surface 100b of the first substrate 100. The protection layer PL may be provided to encapsulate the first package P1, the second package P2, and the connection terminal 150. For example, the protection layer PL may cover the connection terminal 150, the first substrate 100, the first mold layer 120, the connecting portion 251, the second substrate 200, and the second mold layer 220. By virtue of the protection layer PL, the connection terminal 150, the first package P1, the second package P2, and the connecting portion 251 may be prevented from being exposed to outer air or moisture. For example, the protection layer PL may prevent an oxide layer (not shown) from being formed on the connection terminal 150. Furthermore, the first package P1, the second package P2, and the connecting portion 251 may be prevented from corroding.

Hereinafter, a method of fabricating the semiconductor package 4 will be described in brief.

The first package P1 and the second package P2 may be provided. The connecting portion 251 may be formed between the first package P1 and the second package P2. Thereafter, the protection layer PL may be formed on the first package P1, the second package P2, and the connecting portion 251 in the same or similar manner as the method described with reference to FIGS. 2A to 2C or FIG. 2D. The protection layer PL on the first package P1 may be formed in the same chamber as that for the protection layer PL covering the second package P2 and the connection terminal 150. Accordingly, the protection layer PL on the first package P1 may be connected to not only the protection layer PL on the second package P2 but also the protection layer PL on the connection terminal 150. As can be seen in FIGS. 6E and 7, in some embodiments, the protection layer PL may cover both a bottom surface of an upper package, and a top surface of a lower package, with a space therebetween. The same protection layer PL may cover side surfaces of a terminal formed between and connecting the upper package to the lower package (e.g., connecting a package substrate of the upper package to a package substrate of the lower package). As depicted in the embodiment of FIG. 7, the protection layer PL may continuously and conformally cover a bottom surface of the upper package, side surfaces of terminals between the upper package and the lower package, and a top surface of the lower package.

Figure 8:
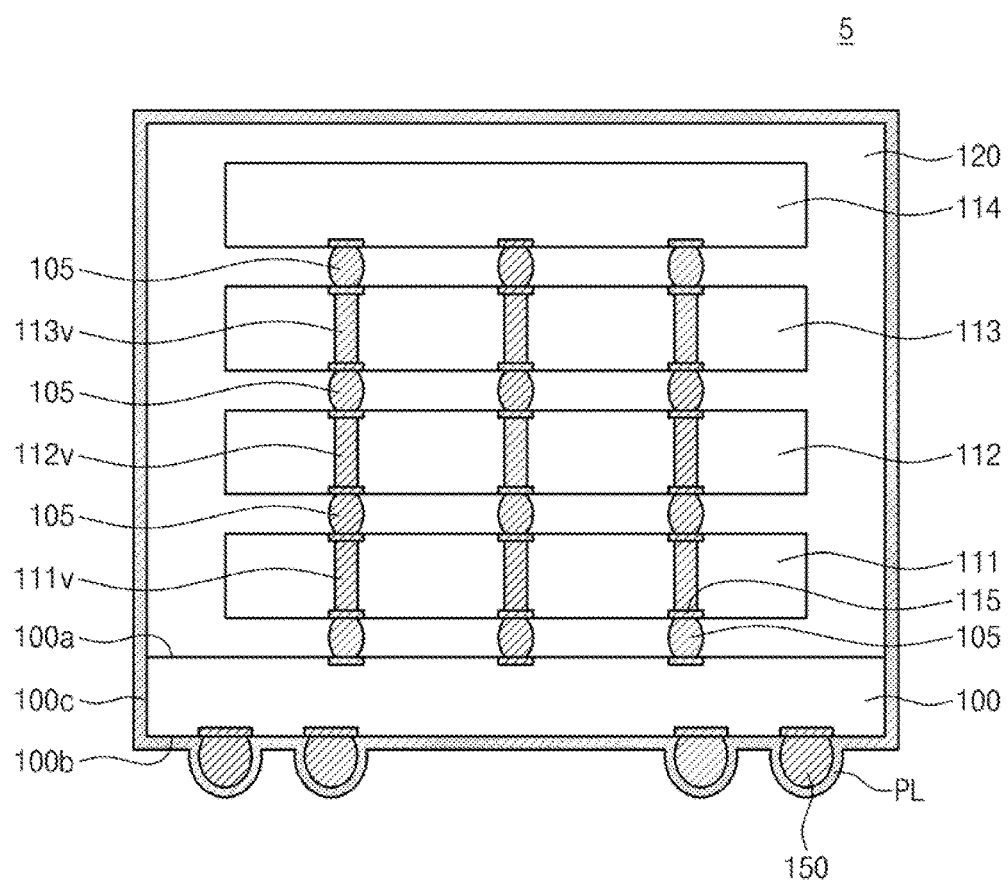
FIG. 8 is a sectional view illustrating a semiconductor package according to some embodiments of the inventive concept.

FIG. 8 is a sectional view illustrating a semiconductor package according to some embodiments of the inventive concept. For concise description, an element or step described in the previous embodiments may be identified by a similar or identical reference number without repeating an overlapping description thereof.

Referring to FIG. 8, a semiconductor package 5 may include the substrate 100, a plurality of semiconductor chips 111, 112, 113, and 114, the mold layer 120, the protection layer PL, and the connection terminal 150. The substrate 100 may be a printed circuit board or a redistribution layer described with reference to FIG. 4. The first semiconductor chip 111 may be provided on the first surface 100a of the substrate 100. Second to fourth semiconductor chips 112, 113, and 114 may be stacked on the first semiconductor chip 111. Vias 111v, 112v, and 113v may be provided to pass through the first to third semiconductor chips 111, 112, and 113, respectively. Interposers 105 (e.g., internal package connection terminals) may be interposed between the substrate 100 and the first semiconductor chip 111 and between the first to fourth semiconductor chips 111, 112, 113, and 114. The number of the semiconductor chips 111, 112, 113, and 114 may not be limited to that of the illustrated example and may be variously changed. The mold layer 120 may be provided on the first surface 100a of the substrate 100 to cover the semiconductor chips 111, 112, 113, and 114. The mold layer 120 may be extended to include at least a portion that is interposed between the substrate 100 and the first semiconductor chip 111 and/or between the second to fourth semiconductor chips 112, 113, and 114. In certain embodiments, an under-fill layer (not shown) may be provided between the substrate 100 and the first semiconductor chip 110 and/or between the second to fourth semiconductor chips 112, 113, and 114. The connection terminal 150 may be disposed on the second surface 100b of the substrate 100.

The protection layer PL may cover the connection terminal 150, the second and third surfaces 100b and 100c of the substrate 100, and the mold layer 120.

FIGS. 9A to 9D are sectional views illustrating semiconductor modules according to some embodiments of the inventive concept. For concise description, an element or step described in the previous embodiments may be identified by a similar or identical reference number without repeating an overlapping description thereof.

Referring to FIGS. 9A to 9D, a semiconductor module 1001, 1002, 1003, or 1004 may include the module substrate 10 and the semiconductor package 2, 3, 4, or 5 mounted on the module substrate 10. A plurality of semiconductor packages may be mounted on the module substrate 10 in the same manner as depicted for a single exemplary semiconductor package shown in FIGS. 9A to 9D. The semiconductor module 1001, 1002, 1003, or 1004 may be fabricated using the same method as described with reference to FIGS. 3A to 3D. For example, alkali solution may be used to remove the protection layer PL and thereby to expose the lower portion 150l of the connection terminal 150. The lower portion 150l of the connection terminal 150 may be coupled to the connection pad 11, and accordingly, the semiconductor module 1001, 1002, 1003, or 1004 may be electrically connected to the module substrate 10. Here, the semiconductor module 1001 of FIG. 9A may be fabricated using the semiconductor package 2 of FIG. 4.

Figure 9A:
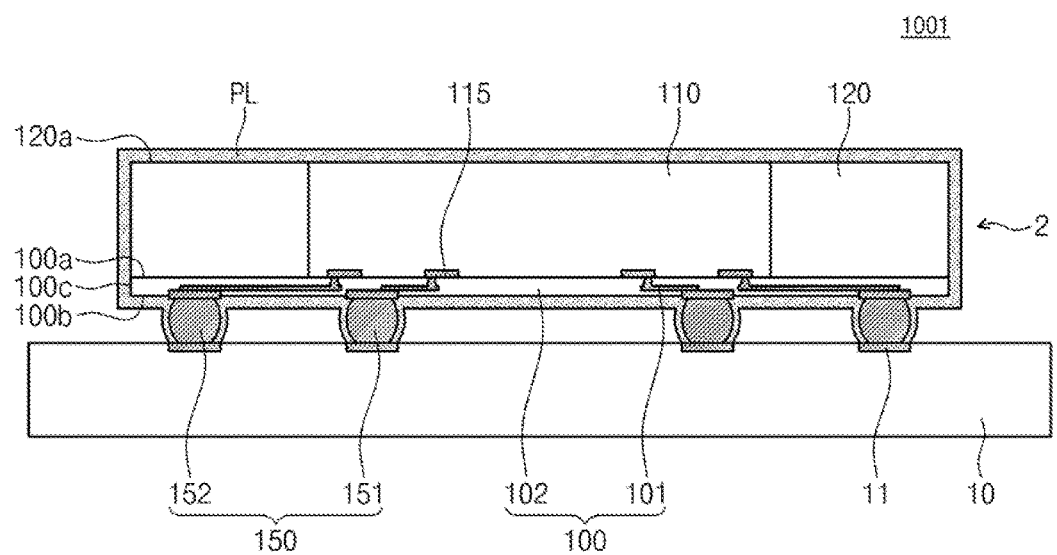
FIGS. 9A to 9D are sectional views illustrating semiconductor modules according to some embodiments of the inventive concept.
Figure 9B:
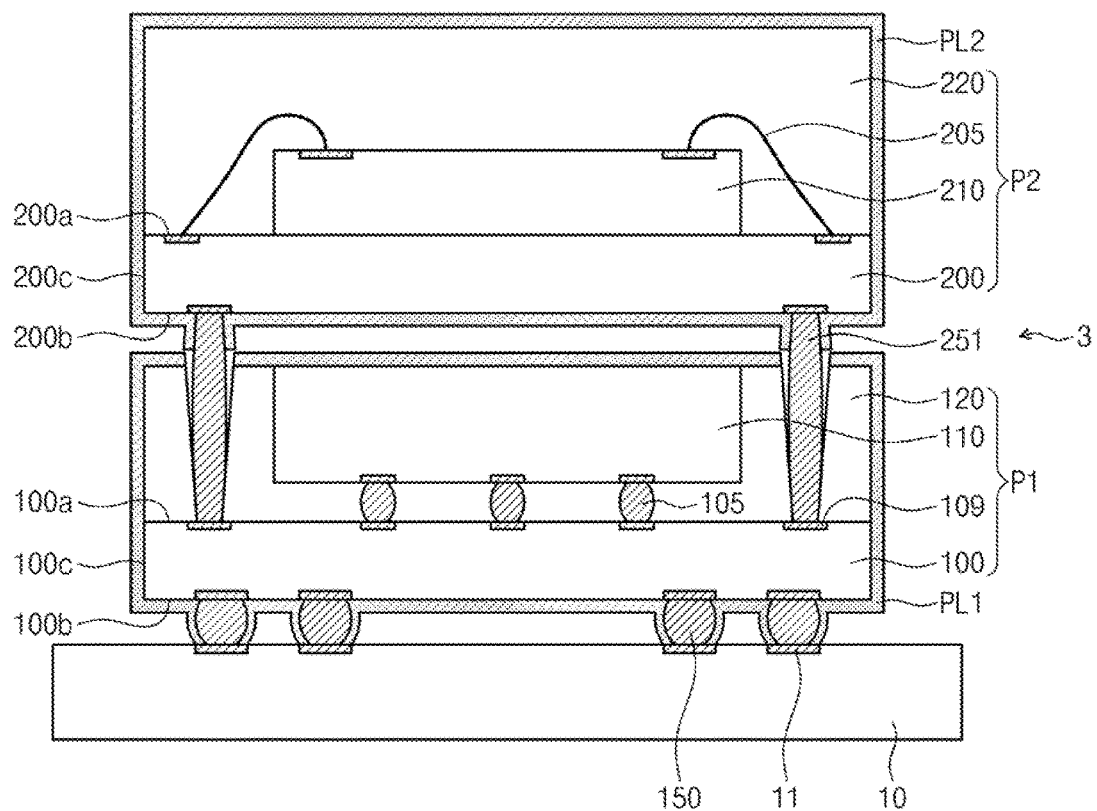

Referring to FIG. 9B, the semiconductor module 1002 may be fabricated using the semiconductor package 3 of FIG. 6.

Figure 9C:
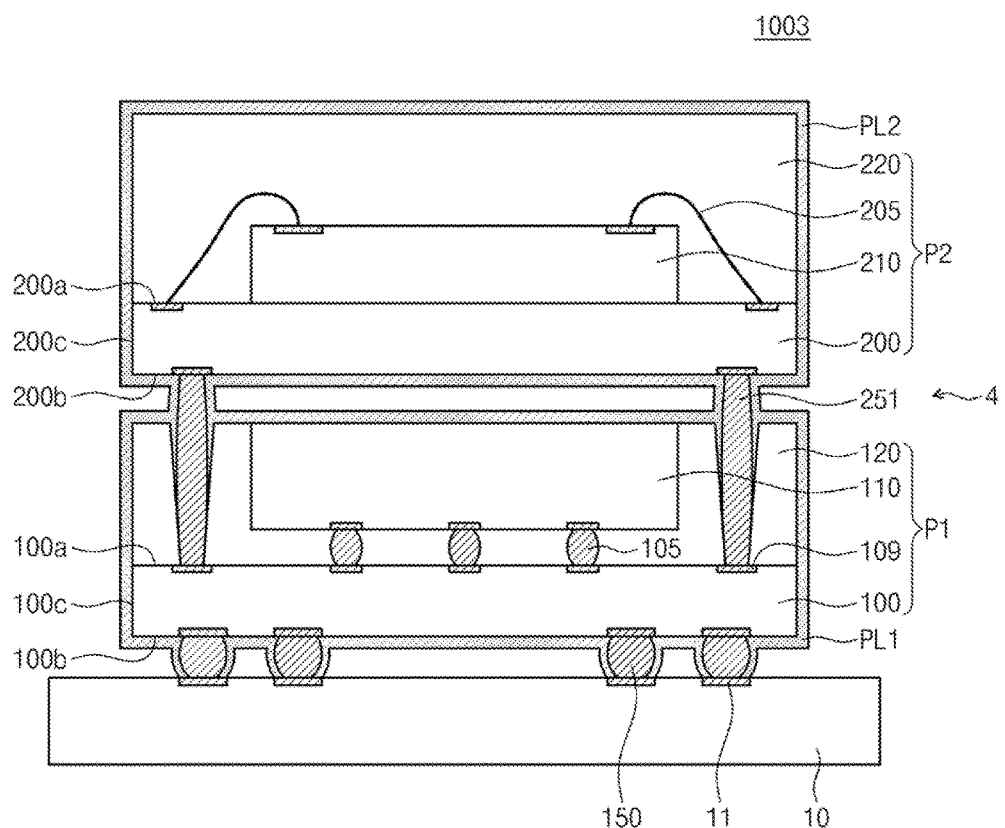

Referring to FIG. 9C, the semiconductor module 1003 may be fabricated using the semiconductor package 4 of FIG. 7E.

Figure 9D:
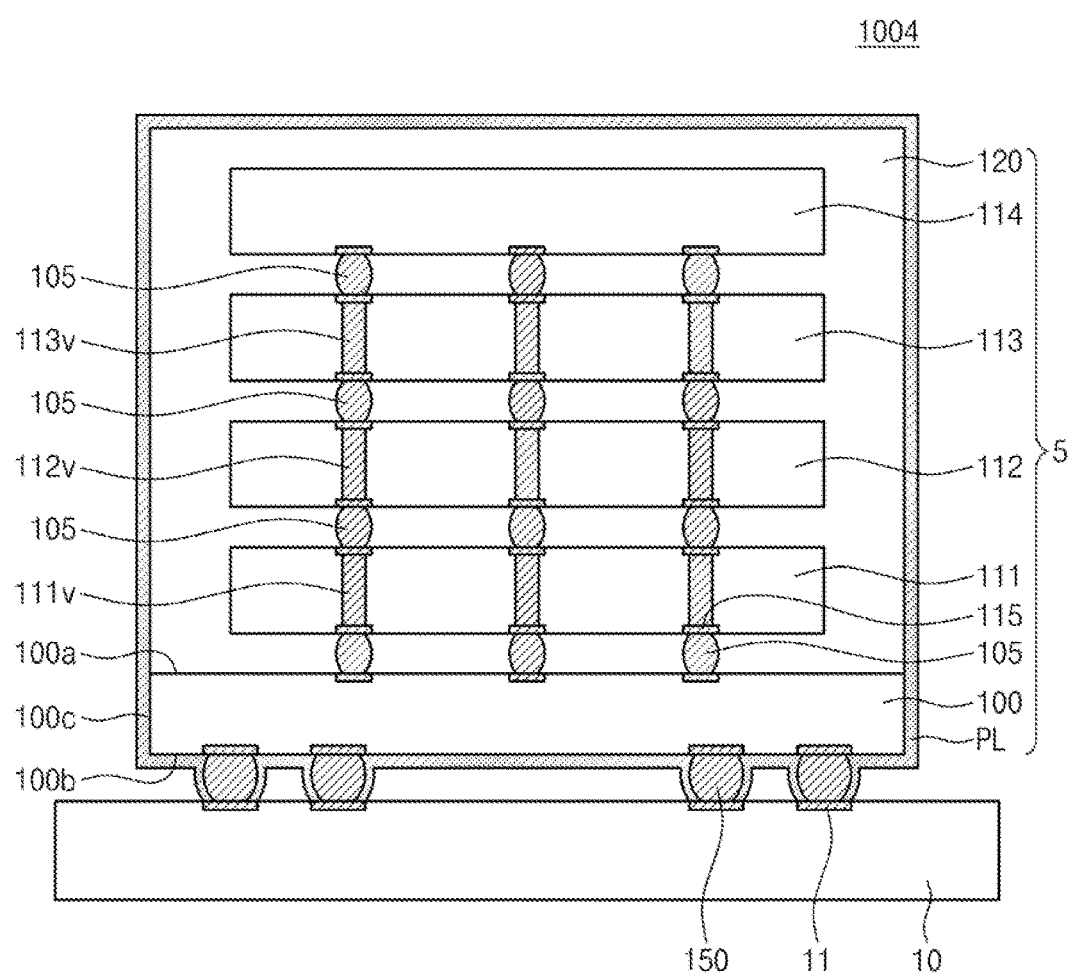

Referring to FIG. 9D, the semiconductor module 1004 may be fabricated using the semiconductor package 5 of FIG. 8.

As described in the various embodiments herein, a chip, substrate, or board, such as a chip 110 or 210, package substrate 100 or 200, or module board 10, may be described as having a first surface and second surface (e.g., top surface and bottom surface). Certain components may be described as contacting the first surface and/or second surface. In addition, a pad may be formed at the first surface or second surface. As discussed herein, pads formed at the external surfaces of and embedded at least partly in a chip, package substrate, or module board, should be considered to form part of the external surfaces (e.g., top or bottom surfaces) of chips, package substrates, or module boards to which they are connected. Thus, as depicted in FIG. 1, for example, the connection terminals 150 contact the second surface 100b of the substrate 100.

The protection layer according to some embodiments of the inventive concept may be applied to semiconductor packages of various types. For example, the semiconductor packages according to some embodiments of the inventive concept may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die on waffle pack technique, a die in wafer form technique, a chip on board (COB) technique, a ceramic dual in-line package (CERDIP) technique, a plastic quad flat package (PQFP) technique, a Plastic Metric Quad Flat Package (PMQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, and a wafer-level stack package (WSP) technique.

According to some embodiments of the inventive concept, a protection layer may be provided on a substrate, a mold layer, and a connection terminal. The protection layer may be formed to contain fluorine, and this allows the protection layer to have an improved waterproof property. Owing to the presence of the protection layer, it may be possible to prevent the connection terminal, the substrate, and the mold layer from being exposed to an outer air or moisture. For example, owing to the presence of the protection layer, it is possible to prevent an oxide layer from being excessively formed on the connection terminal. Furthermore, the protection layer may prevent external moisture from being in contact with or being absorbed into the substrate and the mold layer, and this may make it possible to prevent conductive elements of the semiconductor package from corroding. In particular, in some embodiments, the protection layer may entirely cover otherwise exposed portions of the external conductive terminals of a semiconductor package, to prevent such corrosion. This protection layer may remain on the package until the package is mounted to and connected to an external board, such as a module board. As a result, a semiconductor package and a semiconductor module can be fabricated to have improved reliability and endurance.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
   a first substrate having first and second surfaces facing each other;
   a first semiconductor chip provided on the first surface of the first substrate;
   a connection terminal provided on the second surface of the first substrate, the connection terminal having a first surface facing toward the second surface of the first substrate and a second surface facing away from the first substrate and that extends from one end of the first surface of the connection terminal to an opposite end of the first surface of the connection terminal, wherein the second surface of the connection terminal protrudes away from the second surface of the first substrate; and
   a protection layer covering the second surface of the first substrate and the entire second surface of the connection terminal,
   wherein the protection layer is a nonconductive organic layer configured to prevent an oxide layer from being formed on the connection terminal.

2. The semiconductor package of claim 1, further comprising a first mold layer provided on the first surface of the first substrate to cover the first semiconductor chip.

3. The semiconductor package of claim 2, wherein the protection layer is provided to cover the first mold layer.

4. The semiconductor package of claim 2, further comprising:
   a second substrate on the first semiconductor chip;
   a second semiconductor chip on the second substrate;
   a second mold layer provided on the second substrate to cover the second semiconductor chip; and
   a connecting portion interposed between the first and second substrates.

5. The semiconductor package of claim 4, wherein the protection layer is provided on the second substrate, the second mold layer, and the connecting portion.

6. The semiconductor package of claim 2, further comprising a second semiconductor chip stacked on the first semiconductor chip,
   wherein the first mold layer is provided to cover the first and second semiconductor chips.

7. The semiconductor package of claim 1, wherein the protection layer contains fluorine.

8. The semiconductor package of claim 1, wherein the first substrate comprises a third surface connecting the first surface to the second surface, and
   the protection layer is extended to cover the third surface of the first substrate.

9. The semiconductor package of claim 1, wherein the protection layer has a thickness having a value selected from a range between about 0.1 nm and about 1000 nm.

10. A semiconductor module, comprising;
    a module substrate having a top surface and a bottom surface,
    a first semiconductor package mounted on the top surface of the module substrate, the first semiconductor package comprising a first substrate having a bottom surface facing the module substrate and a top surface, a first semiconductor chip on the first substrate, the first semiconductor chip mounted on the top surface of the first substrate, and a first mold layer covering the first semiconductor chip;
    a connection terminal interposed between the top surface of the module substrate and the bottom surface of the first substrate; and
    a protection layer conformally formed on the bottom surface of the first substrate and on side surfaces of the connection terminal between the bottom surface of first substrate and the top surface of the module substrate,
    wherein the protection layer does not fill a space between the top surface of the module substrate and the bottom surface of the first substrate.

11. The semiconductor module of claim 10, wherein the protection layer covers bottom and side surfaces of the first substrate, and
    the connection terminal is provided on the bottom surface of the first substrate.

12. The semiconductor module of claim 10, wherein the protection layer covers the first mold layer.

13. The semiconductor module of claim 10, wherein the protection layer contains fluorine.

14. The semiconductor module of claim 10, further comprising a second semiconductor package disposed on the first semiconductor package,
   wherein the second semiconductor package comprises a second substrate, a second semiconductor chip, and a second mold layer.

15. The semiconductor module of claim 14, wherein the protection layer covers the second semiconductor package.

16. The semiconductor module of claim 10, wherein the module substrate comprises a pad provided on the top surface thereof, and
   the connection terminal is coupled to the pad.

17. The semiconductor module of claim 10, wherein the protection layer has a thickness having a value selected from a range between about 0.1 nm to about 1000 nm.

18. The semiconductor module of claim 10, wherein the protection layer extends to the top surface of the module substrate.

* * * * *